United States Patent [19]

Taylor

[11] Patent Number: 5,012,202

[45] Date of Patent: Apr. 30, 1991

[54] LOW IMPEDANCE AUTOMATIC GAIN CONTROL CIRCUIT

[75] Inventor: Stewart S. Taylor, Beaverton, Oreg.

[73] Assignee: TriQuint Semiconductor, Inc., Beaverton, Oreg.

[21] Appl. No.: 494,077

[22] Filed: Mar. 15, 1990

[51] Int. Cl.⁵ .................. H03F 3/08; H03G 3/30; H01J 40/14
[52] U.S. Cl. .................. 330/284; 250/214 A; 250/214 AG; 330/308; 455/619
[58] Field of Search ............... 330/59, 145, 284, 308; 250/214 A, 214 AG; 455/619

[56] References Cited

U.S. PATENT DOCUMENTS 4,415,803 11/1983 Muoi .................. 250/214 A
4,540,952 9/1985 Williams .................. 330/279
4,718,119 1/1988 Salzer et al. .................. 455/619

FOREIGN PATENT DOCUMENTS 2650583 3/1978 Fed. Rep. of Germany ...... 330/284

Primary Examiner—James B. Mullins
Attorney, Agent, or Firm—Alan T. McCollom; Peter J. Meza

[57] ABSTRACT

An optical receiver circuit for an incoming optical signal having a variable power level includes an optical detector for receiving the optical signal and generating a current therefrom which varies with the optical signal power level. The current so generated is applied to a transimpedance amplifier. An automatic gain control (AGC) drive circuit is connected around the amplifier thereby increasing its dynamic range. The AGC drive circuit drives a FET which has one side thereof connected to the transimpedance amplifier for shunting current from the input thereof. A negative feedback circuit comprising an amplifier is connected across the FET, which comprises the resistive feedback element, thus reducing the FET resistance by a factor of 1+T, where T is the feedback circuit loop gain.

11 Claims, 2 Drawing Sheets

LOW IMPEDANCE AUTOMATIC GAIN CONTROL CIRCUIT

BACKGROUND OF THE INVENTION

1. Field of the Invention

The present invention relates to automatic gain control circuits and more particularly to such circuits which vary the impedance of a device for shunting current from the input of an amplifier.

2. DESCRIPTION OF THE RELATED ART

Transimpedance amplifiers produce an output voltage signal proportional to an input current signal. Such amplifiers are typically implemented by providing a feedback resistor across the input and output of a voltage amplifier.

A typical use for transimpedance amplifiers is in optical transmission systems. An optical source, such as a laser or light emitting diode, is used to transmit information by modulating the intensity of the light source. An electrooptic device such as a PIN diode or avalanche photodiode receives the optical signal and converts the same to a current which is applied to the input of the transimpedance amplifier. The amplifier thus produces a voltage proportional to the diode current. In optical transmission systems the information transmitted is usually digital and generally is in the form of a pulse train.

Optical transmission systems are typically designed to provide an electrical output signal which has a predetermined amplitude. In the prior art, an automatic gain control (AGC) is used in conjunction with the transimpedance amplifier described above in order to produce an output voltage which comprises a pulse train switched in accordance with the optical source and having a substantially constant amplitude when the input signal is larger than a preselected threshold.

One such AGC circuit is shown in FIG. 37 of Williams U.S. Pat. No. 4,540,952 for a nonintegrating receiver. Such an AGC circuit effectively varies the gain of the transimpedance amplifier in order to maintain the output signal at the desired amplitude for signals above the threshold.

In Williams, a FET is used as a resistive shunt to reduce the value of the current applied to the input terminal of the amplifier in order to increase dynamic range. One side of the FET is connected to the amplifier input, the other side is connected to a bias voltage and the gate is connected to the output of the AGC drive circuit. The Williams device is illustrated schematically in FIG. 1 of the accompanying drawings. In Williams, the bias voltage varies responsive to the average amplifier output voltage. Other prior art circuits use a fixed bias voltage.

The AGC drive circuit produces a control signal which varies in response to the amplifier output. For high amplifier input signal levels, more amplifier input current is shunted thereby increasing the dynamic range of the amplifier. In order to be effective, such a FET must typically have a resistance of 10 ohms or less. Such a FET is typically one to several thousand microns wide. This takes up a tremendous amount of space on a chip and also adds a large amount of unwanted capacitance which lowers the bandwidth and degrades the noise performance.

SUMMARY OF THE INVENTION

A main amplifier has an input terminal and an output terminal. The input terminal of an automatic gain control (AGC) drive circuit is connected to the output terminal of the main amplifier. The AGC drive circuit develops a signal related to the signal appearing on the output terminal of the main amplifier. A variable impedance device is operatively connected to the AGC drive circuit and to the input terminal of the main amplifier for shunting current from the input terminal of the main amplifier responsive to the AGC drive signal. A negative feedback circuit is connected across the variable impedance device for lowering the impedance of the device. The present invention is also implemented in a method.

It is a general object of the present invention to provide a low impedance AGC circuit which overcomes the above-enumerated disadvantages associated with prior art AGC circuits.

It is a more specific object of the invention to provide such a circuit which utilizes a smaller variable impedance device than prior art circuits thus saving die area and improving noise performance and bandwidth.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENTS

Figure 1:
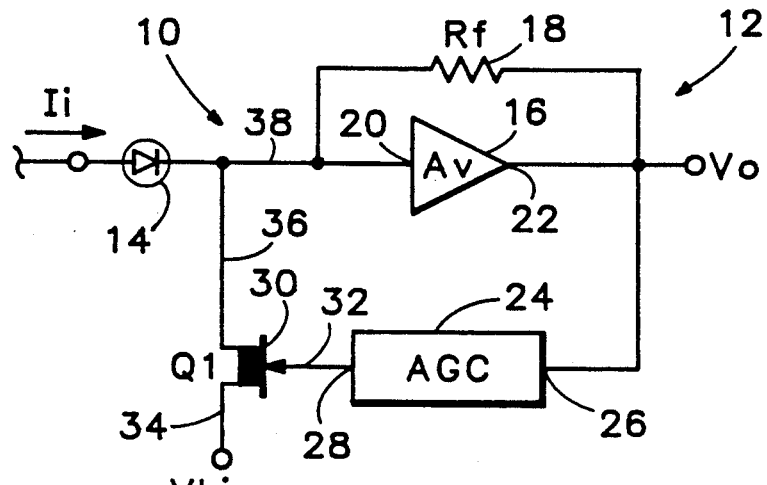
FIG. 1 is a schematic diagram of a prior art amplifier and associated AGC drive circuit.

Indicated generally at 10 in FIG. 1 is a prior art optical receiver circuit. Included therein is a transimpedance amplifier, indicated generally at 12, and an optical detector or photodiode 14. The anode of diode 14 is connected to appropriate biasing circuitry (not shown). Transimpedance amplifier 12 includes a voltage amplifier 16 and a resistive feedback element 18. Amplifier 16 includes an input terminal 20 and an output terminal 22. Voltage amplifier 16 is, in the embodiment of FIG. 1, a conventional voltage amplifier. As such, it supplies an output voltage proportional to its input voltage. Such amplifiers typically have a high input impedance and a low output impedance. Resistive feedback element 18 has one end thereof electrically connected to input terminal 20 and the other end thereof electrically connected to output terminal 22. The addition of element 18 causes amplifier 16 to operate as a transimpedance amplifier which produces an output voltage proportional to an input current.

A conventional automatic gain control (AGC) drive circuit 24 has an input terminal 26 and an output terminal 28. Circuit 24 typically includes a peak, or peak-to-peak detector, a filter and an amplifier. One such circuit is disclosed in Muoi U.S. Pat. No. 4,415,803 for an optical receiver with improved dynamic range.

A FET 30 includes a gate 32. The FET includes one side 34 which is connected to a voltage source (not shown) which provides a preselected bias potential which is substantially equal to the potential on terminal 20 of amplifier 16. FET 30 includes a second side 36 which is connected to a conductor 38.

In operation, optical signals detected by diode 14 generate a current in conductor 38 which transimpedance amplifier 12 converts to a voltage that appears on terminal 22. For relatively low voltages appearing on terminal 22, circuit 24 produces a relatively low voltage on terminal 28 thus biasing FET 30 to a relatively nonconducting condition. Current signals in conductor 38 are thus not shunted through FET 30.

Large current signals in conductor 38 generate large voltages on output terminal 22 of amplifier 16 and on output terminal 28 of AGC drive circuit 24. FET 30 is thus biased into a relatively high conducting condition thereby shunting current from conductor 38 and thus increasing the dynamic range of transimpedance amplifier 12.

Circuit 10 suffers from several disadvantages. In order to effectively shunt current from conductor 38 FET 30 must have a resistance typically of 10 ohms or less. As previously mentioned, such a FET is extremely large thus taking up valuable chip space and adding capacitance to the circuit which adversely effects bandwidth as well as increasing noise. In addition, the voltage supply (not shown) connected to side 34 of FET 30 must have an impedance at least as low as the FET to permit current shunting from conductor 38 through the FET. The total shunt impedance presented at conductor 38 is the series combination of FET 38 and the voltage supply.

Figure 2:
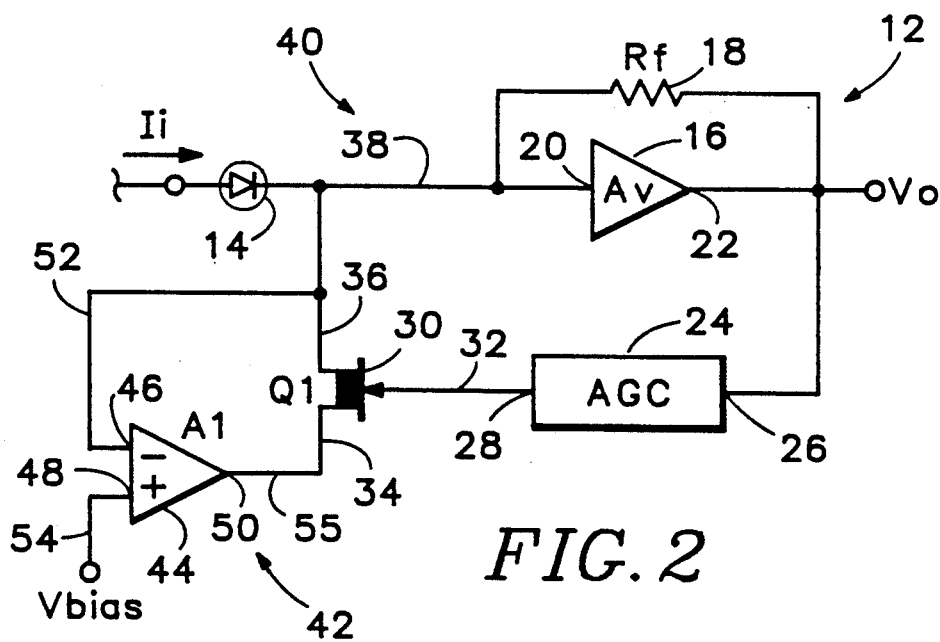
FIG. 2 is a schematic diagram of a circuit constructed in accordance with the present invention.

Turning now to FIG. 2, illustrated generally at 40 is an optical receiver circuit constructed in accordance with the present invention. The structure which corresponds to that previously identified in FIG. 1 retains the same numeral in FIG. 2. Indicated generally at 42 is a negative feedback circuit. Included therein is a differential voltage amplifier 44 having a pair of input terminals 46, 48 and an output terminal 50. In the embodiment of FIG. 2, amplifier 44 is a conventional voltage amplifier. Amplifier 44 operates in the usual fashion in that a voltage signal appears on terminal 50 which is proportional to the difference between the voltage appearing on terminals 46, 48. Conductor 52 connects terminal 46 to conductor 38. Input terminal 48 is connected to a conductor 54 which in turn is connected to a voltage supply (not shown). The voltage supply provides what is referred to herein as a preselected bias potential. In the embodiment of FIG. 2 the bias potential is substantially equal to the potential at the input of transimpedance amplifier 12. Output terminal 50 is connected to a conductor 55 which in turn is connected to side 34 of FET 30. The bias potential and AGC circuit are implemented such that FET 30 is nonconducting when the input signal is below a preselected value.

Figure 3:
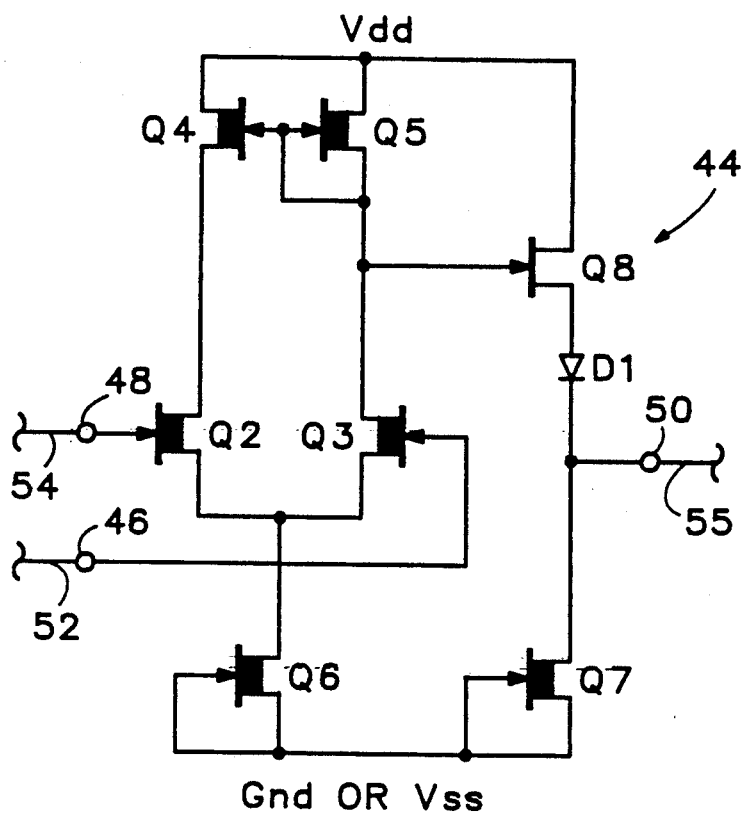
FIG. 3 is a more detailed schematic diagram of a portion of FIG. 2.

One embodiment of amplifier 44 is illustrated in FIG. 3 and is of conventional construction. The conductors and terminals associated with amplifier 44 which were identified in FIG. 2 retain the same numeral in FIG. 3.

In operation, photodiode 14, amplifier 12, AGC drive circuit 24 and FET 30 operate in a similar fashion to the prior art circuit of FIG. 1. That is, current generated by photodiode 14 in conductor 38 produces a proportional voltage on output terminal 22. AGC drive circuit 24 produces a control signal on gate 32 of FET 30 which decreases FET resistance responsive to high voltages on terminal 22 and increases FET resistance responsive to low voltages thereon. FET 30 thus shunts current from conductor 38 thereby increasing the dynamic range of amplifier 12.

Negative feedback circuit 42 has the effect of reducing the resistance of FET 30. Conventional feedback analysis of a shunt negative feedback loop, such as circuit 42, demonstrates that the resistance of the feedback element, in circuit 42 that being FET 30, is reduced by a factor of $1+T$ where T is the loop gain of the feedback circuit. For a shunt negative feedback circuit, like circuit 42, T is approximately equal to the gain of amplifier 44. Such feedback analysis is described in, e.g., Gray, Paul R. & Meyer, Robert G., *Analysis and Design of Analog Integrated Circuits* (Second Ed. 1984).

Thus, if the gain of amplifier 44 is 10, a typical gain for such an amplifier implemented in GaAs technology, the resistance of FET 30 is reduced by a factor of 11. This permits using a relatively small FET thus avoiding the disadvantages associated with the use of large FETs in integrated circuits.

Figure 4:
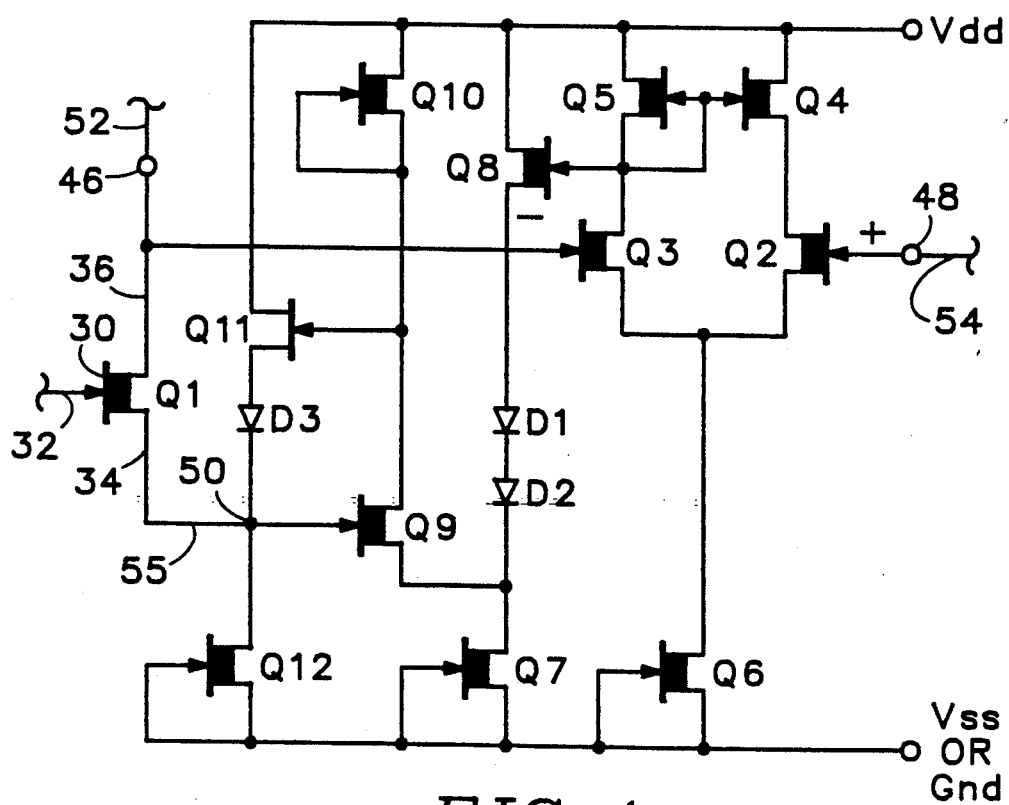
FIG. 4 is a schematic diagram of a portion of a second embodiment of the present invention.

Turning now to FIG. 4, illustrated therein is a modified embodiment of amplifier 44 in FIG. 2. The FIG. 4 amplifier includes the amplifier of FIG. 3, the components of which retain the same numerals in FIG. 4. In addition, an output buffer comprising Q9–Q12 is provided with Q9 generating negative feedback around Q11 thus further lowering the impedance of Q11. Diodes D1, D2, are level shifting diodes. The output impedance of the amplifier of FIG. 4, which appears on terminal 50 in FIG. 4, is thus lower than the output impedance of the FIG. 3 amplifier.

As can be seen in FIG. 2, since amplifier 44 is in series with FET 30, the resistance from side 36 of FET 30 to ground is equal to the resistance of the FET plus the output resistance of the amplifier reduced by the factor of $1+T$. In some design considerations it may be desirable to lower this resistance as much as possible. The amplifier of FIG. 4 thus further lowers the resistance from side 36 of FET 30 to ground.

Having illustrated and described the principles of my invention in a preferred embodiment thereof, it should be readily apparent to those skilled in the art that the invention can be modified in arrangement and detail without departing from such principles.

I claim all modifications coming within the spirit and scope of the accompanying claims.

1. An apparatus for amplifying a signal comprising:
    a main amplifier having an input terminal and an output terminal;
    an automatic gain control (AGC) drive circuit having an input terminal operatively connected to the output terminal of said main amplifier, said AGC drive circuit developing a signal related to the signal appearing on the output terminal of said main amplifier when said apparatus is in operative condition;
    a FET having a gate operatively connected to said AGC drive circuit, said FET having a side operatively connected to the input terminal of said main amplifier for shunting current from the input terminal of said main amplifier responsive to the signal developed by said AGC drive circuit; and
    a differential amplifier connected across said FET, said differential amplifier having a pair of input terminals and an output terminal operatively connected to another side of said FET for lowering the impedance of said FET.

2. The apparatus of claim 1 wherein one of the input terminals of said differential amplifier is operatively connected to the input terminal of said main amplifier and the other input terminal of said differential amplifier is placed at a preselected bias potential when said apparatus is in operative condition.

3. The apparatus of claim 2 wherein said main amplifier comprises a transimpedance amplifier, said differential amplifier comprises a voltage amplifier and said bias potential is substantially equal to the potential at the input terminal of said transimpedance amplifier when said apparatus is in operative condition.

4. The apparatus of claim 1 wherein said differential amplifier further includes an output buffer having a relatively low output impedance.

5. An optical receiver circuit for an incoming optical signal having a variable power level comprising:
   an optical detector for receiving said optical signal and generating a current therefrom which varies with the optical signal power level;
   a transimpedance amplifier having an input terminal and an output terminal;
   means for applying such a current to said input terminal;
   an automatic gain control (AGC) drive circuit having an input terminal operatively connected to the output terminal of said transimpedance amplifier, said AGC drive circuit developing a control signal which varies in response to the voltage signal appearing on the output terminal of said transimpedance amplifier when said apparatus is in operative condition;
   a FET having a gate operatively connected to said AGC drive circuit, said FET having a side operatively connected to the input terminal of said transimpedance amplifier for shunting current from the input terminal of said transimpedance amplifier responsive to the signal developed by said AGC drive circuit; and
   a differential amplifier connected across said FET, said differential amplifier having a pair of input terminals and an output terminal operatively connected to another side of said FET for lowering the impedance of said FET.

6. The apparatus of claim 5 wherein one of the input terminals of said differential amplifier is operatively connected to the input terminal of said transimpedance amplifier and the other input terminal of said differential amplifier is placed at a preselected bias potential when said apparatus is in operative condition.

7. The apparatus of claim 6 wherein said differential amplifier comprises a voltage amplifier and said bias potential is substantially equal to the potential at the input terminal of said transimpedance amplifier when said apparatus i inoperative condition.

8. The optical receiver circuit of claim 5 wherein said differential amplifier further includes an output buffer having a relatively low output impedance.

9. A method for increasing the dynamic range of a main amplifier having an output terminal for providing an output voltage proportional to an input current received at an input terminal, said method comprising the steps of:
   generating a control signal which varies in response to the amplifier output voltage;
   applying the control signal to a FET having an impedance which varies in response to the control signal;
   connecting one side of said FET to the input terminal of the main amplifier to shunt input current therethrough;
   driving one side of said FET with a second amplifier; and
   using the signal on another side of said FET as a feedback signal for said second amplifier, such that the impedance of said FET is lowered.

10. The method of claim 9 wherein said second amplifier is a differential amplifier having an output terminal, a first input terminal to which the feedback signal is applied and a second input terminal, said method further comprising the step of placing a preselected bias potential on said second input terminal.

11. The method of claim 10 wherein the step of placing a preselected bias potential on said second input terminal comprises the step of placing a bias potential thereon which is substantially equal to the potential at the input terminal of the main amplifier.

* * * * *